United States Patent
Saito

(10) Patent No.: US 10,395,742 B2
(45) Date of Patent: Aug. 27, 2019

(54) SEMICONDUCTOR DEVICE

(71) Applicant: Renesas Electronics Corporation, Tokyo (JP)

(72) Inventor: Tomoya Saito, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 9 days.

(21) Appl. No.: 15/434,346

(22) Filed: Feb. 16, 2017

(65) Prior Publication Data

US 2018/0233202 A1 Aug. 16, 2018

(30) Foreign Application Priority Data

Feb. 17, 2016 (JP) ................................. 2016-027532

(51) Int. Cl.
*G11C 16/14* (2006.01)
*H01L 27/11568* (2017.01)
(Continued)

(52) U.S. Cl.
CPC .......... *G11C 16/14* (2013.01); *G11C 16/0425* (2013.01); *H01L 27/11568* (2013.01);
(Continued)

(58) Field of Classification Search
CPC ................................ G11C 16/14; G11C 16/26
(Continued)

(56) References Cited

U.S. PATENT DOCUMENTS

2001/0036107 A1  11/2001 Yamauchi
2005/0135155 A1* 6/2005 Ishimaru ............ G11C 16/0425
                                                                365/185.25
(Continued)

FOREIGN PATENT DOCUMENTS

JP  2001-284555 A  10/2001
JP  2005-332502 A  12/2005
(Continued)

OTHER PUBLICATIONS

Communication dated Jul. 24, 2017, from the European Patent Office in counterpart European Application No. 17151736.0.
(Continued)

*Primary Examiner* — Hoai V Ho
*Assistant Examiner* — Muna A Techane
(74) *Attorney, Agent, or Firm* — Sughrue Mion, PLLC

(57) ABSTRACT

A memory cell of a split gate type MONOS memory is formed over a plate-shaped fin being a part of a semiconductor substrate. In a data erase operation, in a selected memory cell on which erasing is performed, a drain region is applied with 0 V, a memory gate electrode is applied with a positive voltage, and accordingly, erasing is performed by the FN mechanism. Also, in the data erase operation, in an unselected memory cell on which the erasing is not performed, connected to the same memory gate line as the above-described selected memory cell, the drain region is in an open state, and the memory gate electrode is applied with the positive voltage, whereby an induced voltage region is generated in a channel region. Thus, a potential difference between the channel region and the memory gate electrode is small, and accordingly, the erasing is not performed.

16 Claims, 9 Drawing Sheets

(51) Int. Cl.
  *G11C 16/04* (2006.01)
  *H01L 29/423* (2006.01)
  *H01L 29/78* (2006.01)
  *H01L 29/792* (2006.01)

(52) U.S. Cl.
  CPC ...... *H01L 29/42344* (2013.01); *H01L 29/785* (2013.01); *H01L 29/792* (2013.01)

(58) Field of Classification Search
  USPC .................................................. 365/185.29
  See application file for complete search history.

(56) References Cited

U.S. PATENT DOCUMENTS

| | | | |
|---|---|---|---|
| 2006/0022260 A1 | 2/2006 | Hisamoto et al. | |
| 2006/0044873 A1 | 3/2006 | Katayama et al. | |
| 2006/0208307 A1* | 9/2006 | Chang | H01L 21/28273 257/315 |
| 2007/0090443 A1* | 4/2007 | Choi | H01L 21/84 257/314 |
| 2008/0290401 A1 | 11/2008 | Yasui et al. | |
| 2009/0321836 A1* | 12/2009 | Wei | H01L 29/66628 257/365 |
| 2010/0200909 A1 | 8/2010 | Kawashima et al. | |
| 2013/0037877 A1* | 2/2013 | Tan | H01L 21/28273 257/316 |
| 2013/0113035 A1 | 5/2013 | Kawashima et al. | |
| 2016/0071854 A1* | 3/2016 | Hsu | H01L 27/11521 365/185.18 |

FOREIGN PATENT DOCUMENTS

| | | |
|---|---|---|
| JP | 2006-41354 A | 2/2006 |
| JP | 2006-66564 A | 3/2006 |
| JP | 2010-183022 A | 8/2010 |

OTHER PUBLICATIONS

Communication dated Jan. 23, 2019 from the European Patent Office in application No. 17151736.0.
Communication dated May 7, 2019 by the Japanese Patent Office in counterpart Application No. 2016-027532.

\* cited by examiner

SEMICONDUCTOR DEVICE

CROSS-REFERENCE TO RELATED APPLICATION

The present application claims priority from Japanese Patent Application No. 2016-27532 filed on Feb. 17, 2016, the content of which is hereby incorporated by reference into this application.

TECHNICAL FIELD OF THE INVENTION

The present invention relates to a semiconductor device, and more specifically, to a technique that can be effectively applied to a semiconductor device including a memory cell having a fin-type transistor or a memory cell on an SOI.

BACKGROUND OF THE INVENTION

As a non-volatile semiconductor storage device that is electrically writable and erasable, an electrically erasable and programmable read only memory (EEPROM) is widely used. Such storage device represented by a flash memory, which is widely used nowadays, has a conductive floating gate electrode surrounded by an oxide film or a trap insulating film below a gate electrode of a MISFET. A charge storage state of a floating gate or the trap insulating film is used as storage information and is read out as a threshold value of the transistor. The trap insulating film is an insulating film capable of storing a charge, and by way of example, a silicon nitride film is used as such insulating film. By injecting and releasing the charge to such charge storage region, the threshold value of the MISFET is shifted, whereby the MISFET is operated as a storage element. As the flash memory, there is a split gate type cell using a metal-oxide-nitride-oxide-semiconductor (MONOS) film.

As a field effect transistor that has a high operating speed and is capable of reducing a leakage current and power consumption as well as being miniaturized, a fin-type transistor has been known. The fin-type transistor, or a fin field effect transistor (FINFET) is a semiconductor element, for example, having a semiconductor layer pattern formed on a substrate as a channel layer and having a gate electrode formed so as to stride over the pattern.

As a semiconductor device capable of suppressing short channel characteristics and suppressing element variation, a semiconductor device using a silicon-on-insulator (SOI) substrate is currently used. The SOI substrate is a substrate having a supporting substrate composed of highly-resistive silicon (Si) and the like, a buried oxide (BOX) film formed over the supporting substrate, and a thin layer mainly containing Si (silicon layer, SOI layer) formed over the BOX film.

In Japanese Patent Application Laid-Open Publication No. 2005-332502 (Patent Document 1), a memory array (memory cell array) structure of an EEPROM is described.

In Japanese Patent Application Laid-Open Publication No. 2006-041354 (Patent Document 2), a memory array structure of a MONOS memory having a split gate structure is described.

SUMMARY OF THE INVENTION

In an EEPROM, an erase operation can be performed by individually selecting a memory cell. In the EEPROM, however, such bit-by-bit erasing is achieved by controlling a potential of a well for each memory cell, whereby a large area is required for isolating the individual well.

In contrast, by performing the bit-by-bit erase operation in a split gate type MONOS memory in which a potential of a well is not controlled for each memory cell, a reduction of a device area can be achieved. However, since a source line and a memory gate line are provided in parallel, it is necessary to perform the erase operation, for example, all at once on all of a plurality of memory cells arranged in one row in parallel with the source line, whereby there is a problem in that it is not possible to select each of the memory cells at the time of the erase operation.

Other objects and novel characteristics of the present invention will be apparent from the description of the present specification and the accompanying drawings.

The typical ones of the inventions disclosed in the present application will be briefly described as follows.

A semiconductor device according to one embodiment includes a memory cell of a split gate type MONOS memory formed over a fin. When performing an erase operation of data by an FN method, in an unselected memory cell on which erasing is not performed, a drain electrode is in an open state, and a memory gate electrode is applied with a positive voltage, whereby an induced voltage region is generated in a channel region.

According to one embodiment disclosed in the present application, it is possible to improve performance of the semiconductor device. It is possible to achieve an increase of storage capacity, scaling, and the like of the semiconductor device having the EEPROM memory array (memory cell array) structure.

BRIEF DESCRIPTIONS OF THE DRAWINGS

DESCRIPTIONS OF THE PREFERRED EMBODIMENTS

Figure 1:
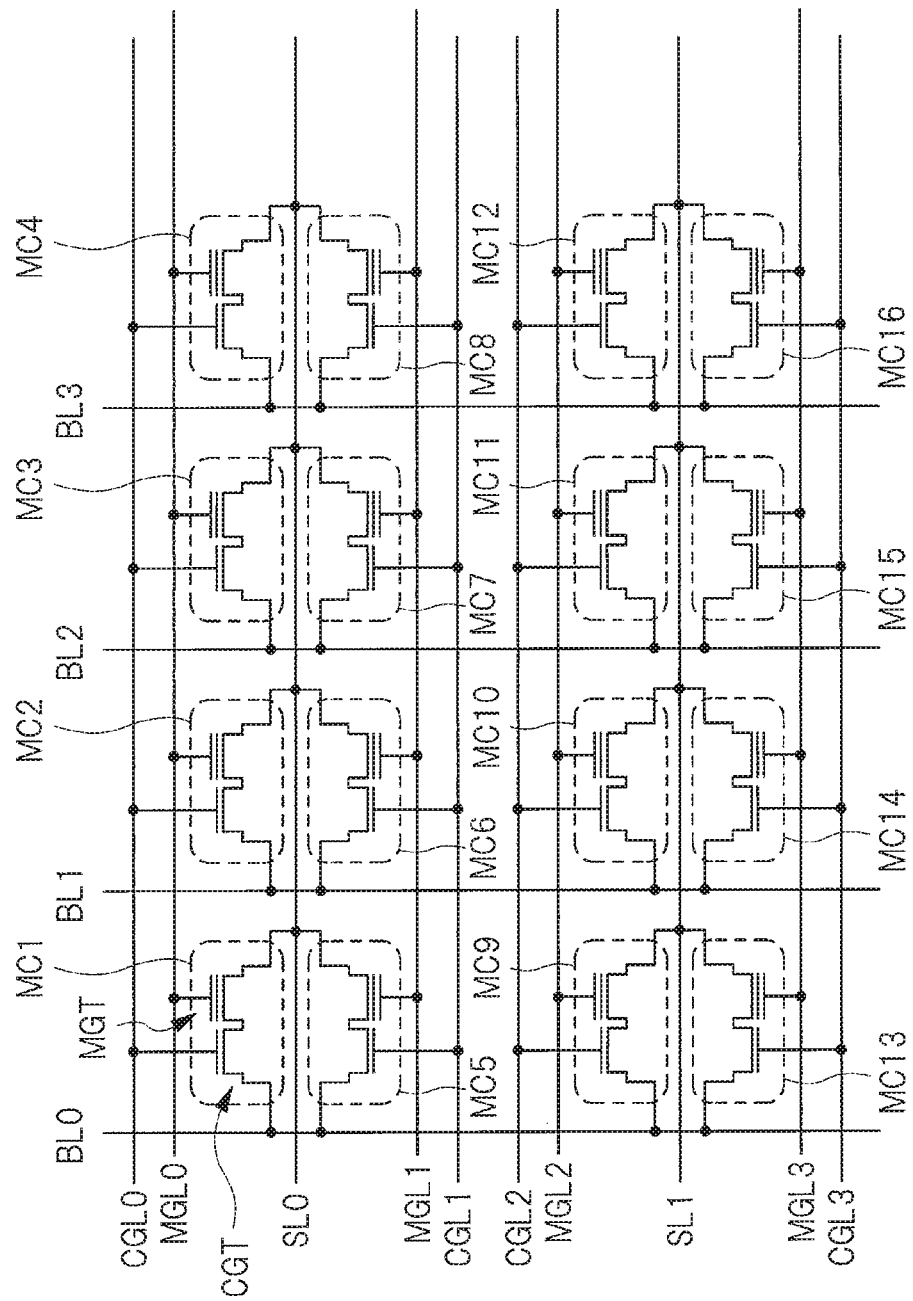
FIG. 1 is an equivalent circuit diagram illustrating a memory array constituting a semiconductor device according to a first embodiment of the present invention.

Hereinafter, embodiments of the present invention will be described in detail with reference to the accompanying drawings. Note that components having the same function are denoted by the same reference characters throughout the drawings for describing the embodiments, and the repetitive description thereof is omitted. In addition, the description of the same or similar portions is not repeated in principle unless particularly required in the following embodiments.

First Embodiment

<Structure of Semiconductor Device>

Hereinafter, a structure of a semiconductor device according to the first embodiment will be described with reference to FIGS. 1 to 9. The semiconductor device according to the first embodiment is capable of performing erasing of information bit by bit on a split gate type MONOS memory constituted by a fin-type transistor, whereby an increase of storage capacity, scaling, and the like of the semiconductor device having an EEPROM memory array (memory cell array) structure can be achieved.

Figure 2:
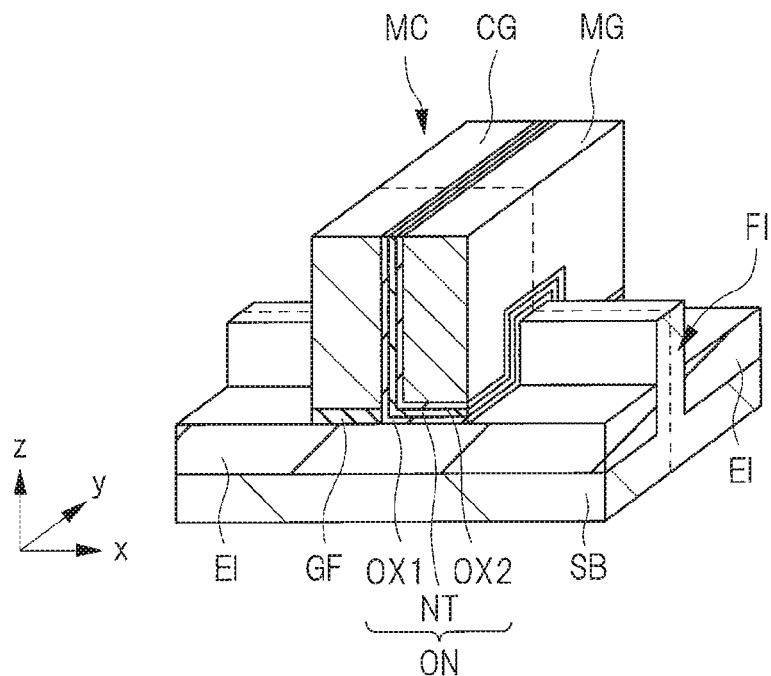
FIG. 2 is a perspective view illustrating the semiconductor device according to the first embodiment of the present invention.
Figure 4:
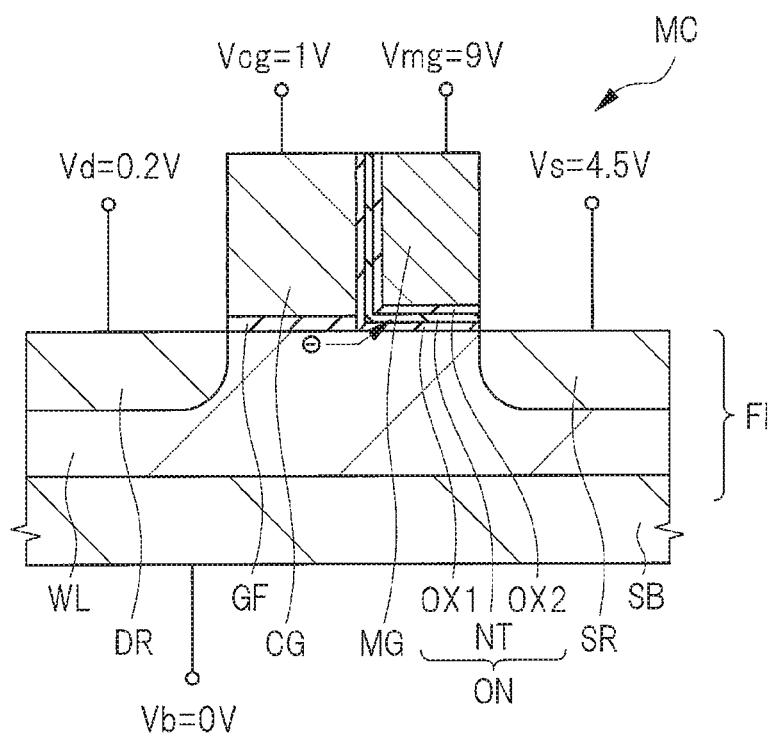
FIG. 4 is a cross-sectional view illustrating the semiconductor device according to the first embodiment of the present invention.
Figure 5:
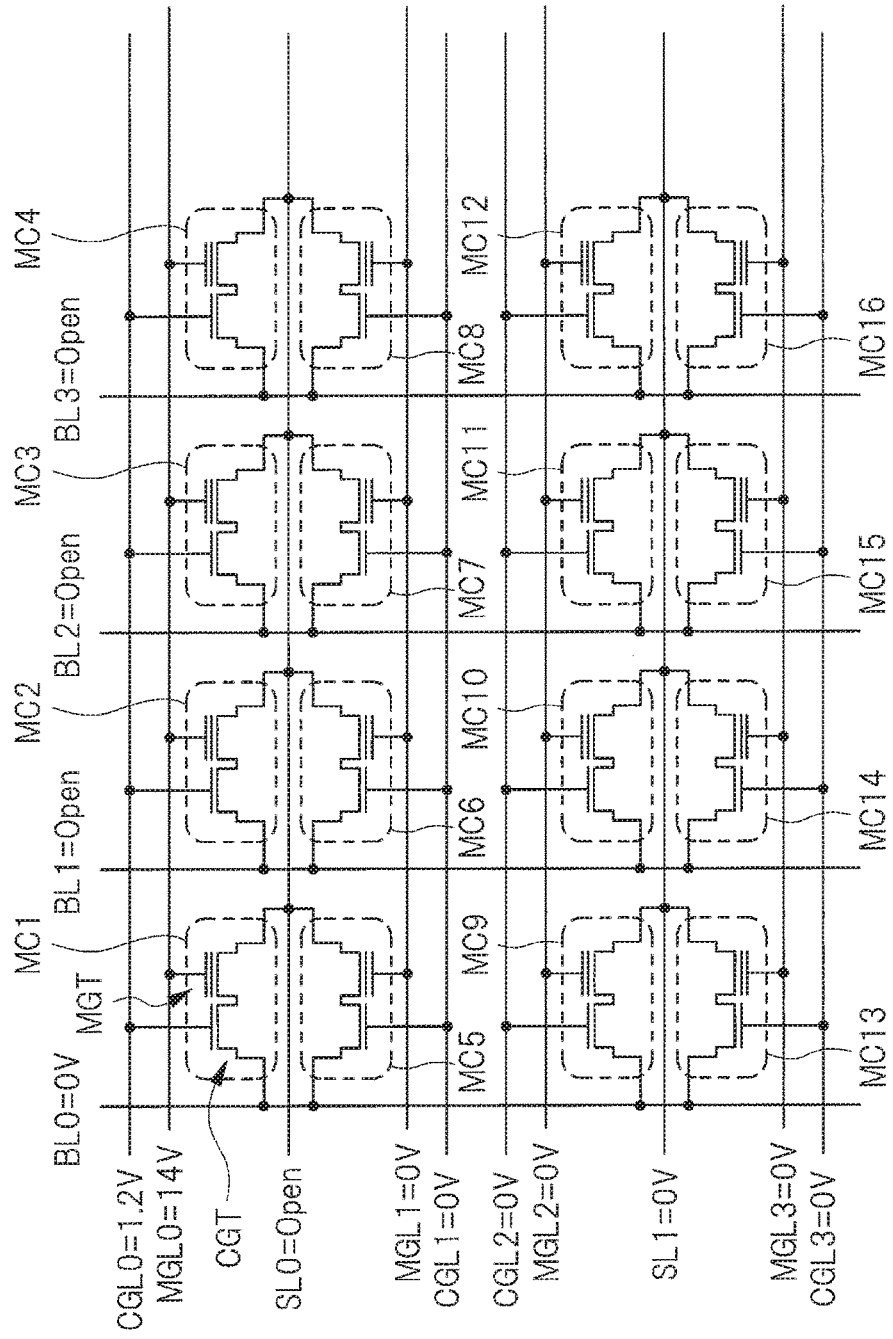
FIG. 5 is an equivalent circuit diagram illustrating the memory array constituting the semiconductor device according to the first embodiment of the present invention.
Figure 6:
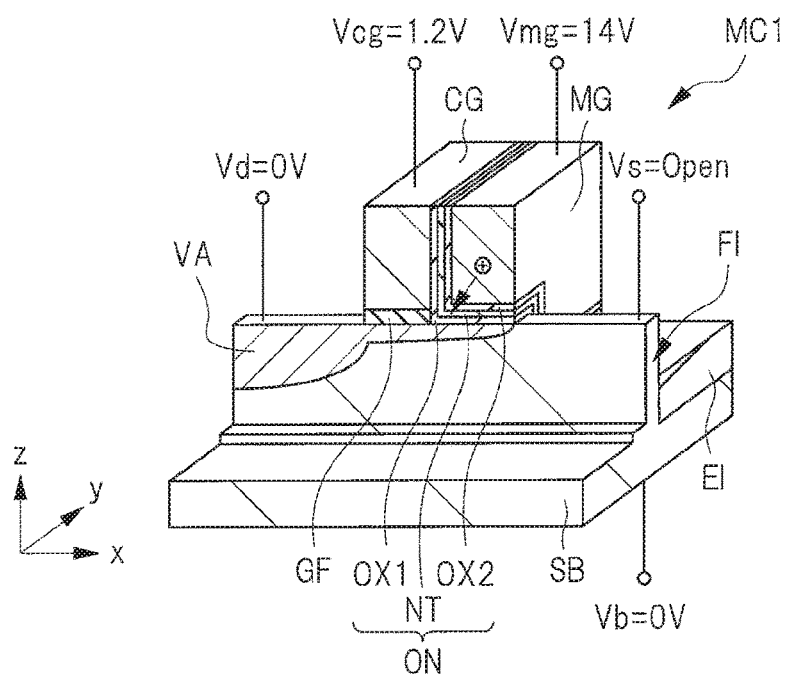
FIG. 6 is a perspective view illustrating the semiconductor device according to the first embodiment of the present invention, in a state in which the semiconductor device is partially broken and omitted.

FIGS. 1 and 5 are equivalent circuit diagrams illustrating a memory array constituting a non-volatile memory, which is the semiconductor device according to the first embodiment. FIGS. 2, 6, and 8 are perspective views illustrating a memory cell constituting the semiconductor device according to the first embodiment. FIGS. 3, 4, 7, and 9 are cross-sectional views illustrating the memory cell constituting the semiconductor device according to the first embodiment. Note that, in FIGS. 1 and 5, each of the memory cells (bit) is surrounded by a dashed line. In FIGS. 2 to 4 and FIGS. 6 to 9, illustration of an interlayer insulating film, a contact plug, a silicide layer, a wiring layer, and the like that are formed on the memory cell is omitted. Also, in the perspective views of FIGS. 6 and 8, the memory cell and a fin are illustrated in a state in which the memory cell and the fin are partially broken and omitted.

First, an equivalent circuit of the memory array provided with a plurality of memory cells according to the first embodiment is illustrated in FIG. 1. Here, the 16-bit memory cells arranged in an array are illustrated. That is, 16 memory cells MC1 to MC16 are illustrated in FIG. 1. The memory cells repeatedly arranged in this manner constitute the memory array. In the memory array, 16 memory cells (MC1, MC2, etc.) are arranged, and bit lines (drain lines) BL0, BL1, BL2, and BL3 extending in a column direction are arranged. Also, in the memory array, control gate lines CGL0, CGL1, CGL2, and CGL3, memory gate lines MGL0, MGL1, MGL2, and MGL3, and source lines SL0 and SL1 which extend in a direction intersecting with the bit lines BL0 to BL3 (row direction) are arranged.

Each of the bit lines BL0 to BL3, the memory gate lines MGL0 to MGL3, the source lines SL0 and SL1, and the control gate lines CGL0 to CGL3 is constituted by a metal wire (signal line) formed on each of the memory cells MC1 to MC16.

Note that the row direction referred to in the present application is a direction in which the memory cells arranged in one row (e.g., the memory cells MC1 to MC4) are arranged among the plurality of memory cells arranged in a matrix in the memory array. Also, the column direction referred to in the present application is a direction orthogonal to the row direction and is a direction in which the memory cells arranged in one column (e.g., the memory cells MC1, MC5, MC9, and MC13) are arranged among the plurality of memory cells arranged in the matrix in the memory array.

Figure 3:
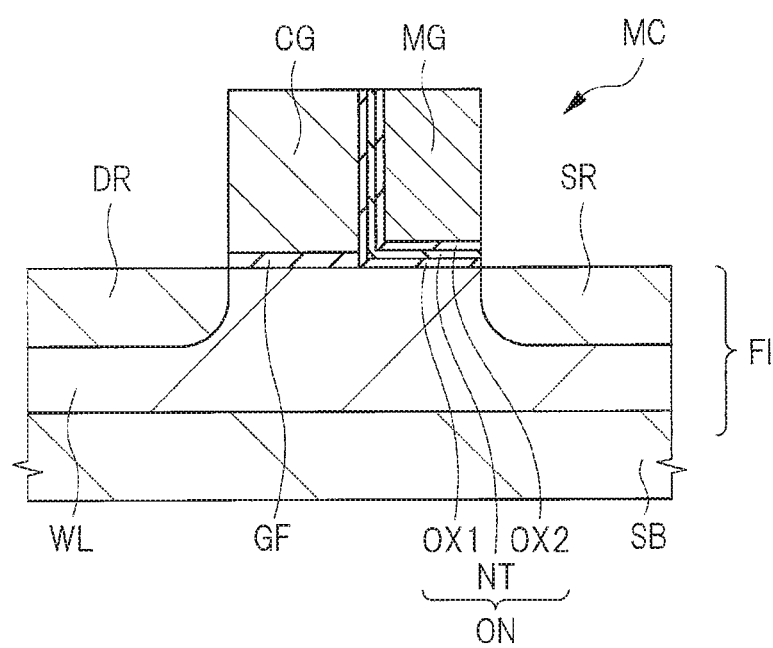
FIG. 3 is a cross-sectional view illustrating the semiconductor device according to the first embodiment of the present invention.

In FIG. 1, one memory cell surrounded by the dashed line has a structure illustrated in FIGS. 2 and 3. FIG. 3 is a cross-sectional view of a part along a dashed line illustrated in FIG. 2. That is, FIG. 3 is the cross-sectional view including a fin FI illustrated in FIG. 2 taken along an extending direction (x direction) of the fin FI.

As illustrated in FIG. 2, a plurality of trenches are formed in an upper surface of a semiconductor substrate SB, and between the adjacent trenches, the fin FI which is a part of the semiconductor substrate SB is formed. The semiconductor substrate SB is composed of single-crystal silicon, for example. The fin FI is a plate-like (wall-like) pattern (protruding portion) protruding upward from a bottom surface of the above-described trench, and the fin FI extends in the x direction along a main surface of the semiconductor substrate SB. Here, a thickness of the fin FI in a y direction that is orthogonal to the x direction as well as in the direction along the main surface of the semiconductor substrate is 20 nm, for example, which is very small compared to a width of the fin FI in the x direction.

In the above-described plurality of trenches, an element isolation region EI that fills from the bottom surface of each of the trenches up to the middle of a height of side walls of the fin FI is formed. The element isolation region EI is composed of a silicon oxide film, for example, and covers a lower part of the side walls of the fin FI. That is, above the element isolation region EI, a part of the fin FI including an upper surface of the fin FI is exposed from the element isolation region EI. In other words, an upper part of the fin FI, which is a part of the fin FI, protrudes above from an upper surface of the element isolation region EI. A difference in height between the upper surface of the element isolation region EI and the upper surface of the fin FI, for example, is about twice the above-described thickness of the fin FI in the y direction. For example, the difference in height between the upper surface of the element isolation region EI and the upper surface of the fin FI is 40 nm.

Over the element isolation region EI and the fin FI, a control gate electrode CG is formed interposing a gate insulating film GF. The control gate electrode CG is composed of a conductor film extending in the y direction and covers the upper surface of the element isolation region EI as well as the side walls and the upper surface of the fin FI interposing the gate insulating film GF. Also, over one side wall of the control gate electrode CG in the x direction, a memory gate electrode MG is formed interposing an ONO film ON. That is, over the element isolation region EI and the fin FI, the memory gate electrode MG is formed interposing the ONO film ON. The memory gate electrode MG is composed of a conductor film extending in the y direction and covers the upper surface of the element isolation region EI as well as the side walls and the upper surface of the fin FI interposing the ONO film ON. That is, the memory gate electrode MG sandwiches the fin FI in the y direction.

An upper surface of each of the control gate electrode CG and the memory gate electrode MG is made to be flat. The ONO film ON is continuously formed from a region between the control gate electrode CG and the memory gate electrode MG to a region between the memory gate electrode MG and the fin FI. Thus, the ONO film ON has an L sectional shape as illustrated in FIG. 3.

The control gate electrode CG and the memory gate electrode MG are composed of a polysilicon film, for example. Also, the gate insulating film GF is composed of a silicon oxide film, for example. The ONO film ON is a layered film including a silicon oxide film (bottom oxide film) OX1, a silicon nitride film (charge storage film) NT, and a silicon oxide film (top oxide film) OX2 that are layered in order on a side of the main surface of the semiconductor substrate (upper surface of the fin FI), the side walls of the fin FI, the side wall of the control gate electrode CG, and the upper surface of the element isolation region EI. In the x direction, the control gate electrode CG and the memory gate electrode MG are arranged adjacent to each other interposing the ONO film ON. A pattern constituted by the control gate electrode CG and the memory gate electrode MG strides over apart of the fin FI over the upper surface of the element isolation region EI, and the other part of the fin FI is exposed to a lateral region in the x direction of the pattern.

Although illustration is omitted in FIG. 2, as illustrated in FIG. 3, source and drain regions are formed in the upper surface of the fin FI lateral to the above-described pattern in the x direction. That is, a source region SR is formed in the lateral region of the above-described pattern and in the upper surface of the fin FI on a side of the memory gate electrode MG. Furthermore, a drain region DR is formed in the lateral region of the above-described pattern and in the upper surface of the fin FI on a side of the control gate electrode CG. Although illustration is omitted in FIG. 2, as illustrated in FIG. 3, a well WL having a formation depth deeper than those of the source region SR and the drain region DR is formed in the upper surface of the fin FI.

The well WL is a p-type semiconductor region, and the source region SR and the drain region DR are n-type semiconductor regions. Each of the source region SR and the drain region DR has an extension region having a small n-type impurity concentration and a diffusion region having a higher n-type impurity concentration than that of the extension region; however, these regions are not distinguished in the drawing herein and are illustrated as one semiconductor region. Note that the extension region may not be formed. A p-type impurity introduced to the p-type well WL is boron (B), for example, and an n-type impurity introduced to each of the source region SR and the drain region DR is phosphorus (P) or arsenic (As), for example.

Here, the source region SR, the drain region DR, and the control gate electrode CG constitute a control transistor having a metal insulator semiconductor field effect transistor (MISFET) structure. Also, the source region SR, the drain region DR, and the memory gate electrode MG constitute a memory transistor having the MISFET structure. That is, in the upper surface of the fin FI, a region sandwiched by the source region SR and the drain region DR is a channel region in which a channel is formed when the control transistor and the memory transistor operate. Also, the control transistor and the memory transistor share the source region SR and the drain region DR. The control transistor and the memory transistor are fin-type field effect transistors (FINFET) formed on the fin FI.

By the control transistor and the memory transistor, a memory cell MC of the split gate type MONOS memory is constituted. The memory cell MC includes the source region SR, the drain region DR, the ONO film ON, the control gate electrode CG, and the memory gate electrode MG. The memory cells MC1 to MC16 illustrated in FIG. 1 have the same structure as that of the memory cell MC in FIGS. 2 and 3. That is, each of the memory cells MC1 to MC16 illustrated in FIG. 1 is provided with a control transistor CGT and a memory transistor MGT.

As illustrated in FIGS. 1 and 3, the control gate electrode CG is connected to the control gate line CGL0, CGL1, CGL2, or CGL3. The memory gate electrode MG is connected to the memory gate line MGL0, MGL1, MGL2, or MGL3. The drain region DR is connected to the bit line (drain line) BL0, BL1, BL2, or BL3. The source region SR is connected to the source line SL0 or SL1. Furthermore, a potential is supplied to the well WL illustrated in FIG. 3.

<Write Operation of Memory Cell>

The memory cell according to the first embodiment has the MISFET structure, and a charge storage state in a charge storage film (trap insulating film) of a gate insulating film of the MISFET is used as storage information and is read as a threshold value of the transistor. The trap insulating film is an insulating film capable of storing a charge, and by way of example, a silicon nitride film is used as such insulating film. By injecting and releasing the charge to such charge storage region, the threshold value of the MISFET is shifted, whereby the MISFET is operated as a storage element. As in the memory cell according to the first embodiment, the split gate type MONOS memory is one of non-volatile semiconductor storage devices using the trap insulating film. According to the present application, injection of an electron into the silicon nitride film NT, which is a charge storage portion in the ONO film ON of the memory transistor, is defined as "writing," and injection of a hole (positive hole) thereinto is defined as "erasing."

Hereinafter, the write operation of the memory cell according to the first embodiment will be described with reference to FIG. 4. FIG. 4 is a cross-sectional view of the memory cell in the same position as FIG. 3. A selected memory cell referred to herein is a memory cell selected as a target for performing "writing," "erasing," or "reading."

As a writing mechanism, there are a so-called source side injection (SSI) method in which the writing is performed by injection of a hot electron on a source side (hot electron injection writing mechanism) and a so-called Fowler Nordheim (FN) mechanism in which the writing is performed by FN tunneling (tunneling writing mechanism). In the present application, a case in which the writing is performed by the SSI mechanism will be described; however, the FN mechanism may also be used as the writing mechanism.

Here, a voltage applied to the control gate electrode CG through the control gate line CGL0, CGL1, CGL2, or CGL3 (see FIG. 1) is indicated as Vcg. Also, a voltage applied to the memory gate electrode MG through the memory gate line MGL0, MGL1, MGL2, or MGL3 (see FIG. 1) is indicated as Vmg. Moreover, a voltage applied to the drain region DR through the bit line BL0, BL1, BL2, or BL3 (see FIG. 1) is indicated as Vd. Further, a voltage applied to the source region SR through the source line SL0 or SL1 (see FIG. 1) is indicated as Vs. Still further, a voltage applied to the well WL (semiconductor substrate SB) is indicated as Vb.

In the write operation of the SSI mechanism, the voltage applied to each part of the selected memory cell on which the writing of information (data) is performed is Vmg=9 V, Vs=4.5 V, Vcg=1 V, Vd=0.2 V, and Vb=0 V, for example, as illustrated in FIG. 4. Accordingly, a hot electron is generated in the channel region under the memory gate electrode MG and the control gate electrode CG, and the hot electron is injected into the silicon nitride film NT which is the charge storage portion in the ONO film ON under the memory gate electrode MG. The hot electron (electron) that has been injected is captured by a trap level of the silicon nitride film NT constituting the ONO film ON, and as a result, a threshold voltage of the memory transistor is increased. That is, the memory transistor enters a writing state.

In contrast, the voltage applied to each part of an unselected memory cell on which the writing of information (data) is not performed is Vmg=9 V, Vs=4.5 V, Vcg=0 V, Vd=1.3 V, and Vb=0 V, for example. That is, the voltages applied to the control gate electrode CG and the drain region DR are different from those in the transistor selected to perform the writing. In the write operation, the writing is performed only on the memory cell MC in which the voltage Vcg is 1 V and the voltage Vd is 0.2 V, and the writing is not performed on the memory cell MC in which the voltage Vcg is 0 V or the voltage Vd is 1.3 V.

At this time, since the control gate lines CGL0 to CGL3 that supply the voltage Vcg and the bit lines BL0 to BL3 that supply the voltage Vd intersect with each other, it is possible to perform the writing by selecting a specific memory cell in the memory cell array. That is, it is possible to perform the writing bit by bit.

<Erase Operation of Memory Cell>

Next, an erase operation of the memory cell according to the first embodiment will be described with reference to FIGS. 5 to 9. As an erasing mechanism, there are a so-called band-to-band tunneling (BTBT) mechanism in which the erasing is performed by injecting a hot hole by the BTBT (hot hole injection erasing mechanism) and a so-called Fowler Nordheim (FN) mechanism in which the erasing is performed by the FN tunneling (tunneling erasing mechanism). In the first embodiment, the erasing is performed by the FN mechanism and not by using the BTBT mechanism.

Note that, in the erase operation, there is only one pattern of the voltage applied to each part of the selected memory cell; however, there are three patterns of the voltage applied to each part of the unselected memory cell. That is, the voltage application pattern of the unselected memory cell is different among the unselected memory cell arranged in the same row as the selected memory cell on which the erasing is performed, the unselected memory cell arranged in the same column as the selected memory cell, and the unselected memory cell arranged in a different row from the selected memory cell and arranged in a different column from the selected memory cell.

FIG. 5 is an equivalent circuit diagram illustrating the memory array constituting the non-volatile memory which is the semiconductor device. A configuration of the equivalent circuit diagram illustrated in FIG. 5 is the same as a configuration thereof illustrated in FIG. 1. In FIG. 5, there is illustrated an exemplary voltage applied to each signal line in the erase operation. Note that "Open" illustrated in FIG. 5 means that a predetermined part of an element (terminal) is not applied with any potential and is in an open (floating) state. For example, in a case where a transistor is serially connected between a signal line such as a bit line and a device that supplies a voltage to the signal line, when the transistor is off, the signal line is in an open state in which no voltage is applied thereto.

Figure 7:
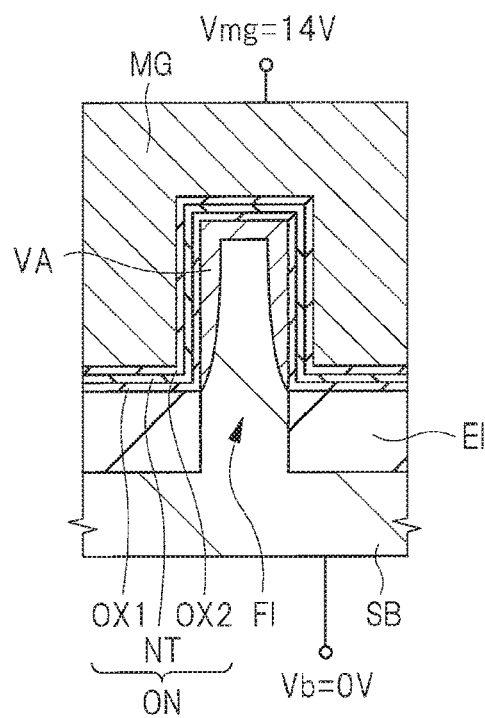
FIG. 7 is a cross-sectional view illustrating the semiconductor device according to the first embodiment of the present invention.
Figure 8:
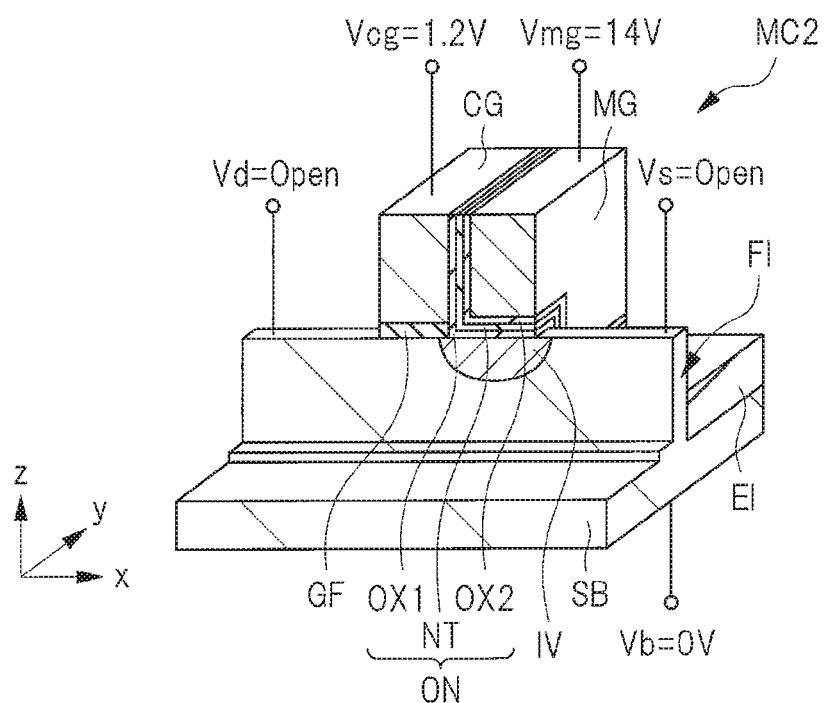
FIG. 8 is a perspective view illustrating the semiconductor device according to the first embodiment of the present invention, in a state in which the semiconductor device is partially broken and omitted.
Figure 9:
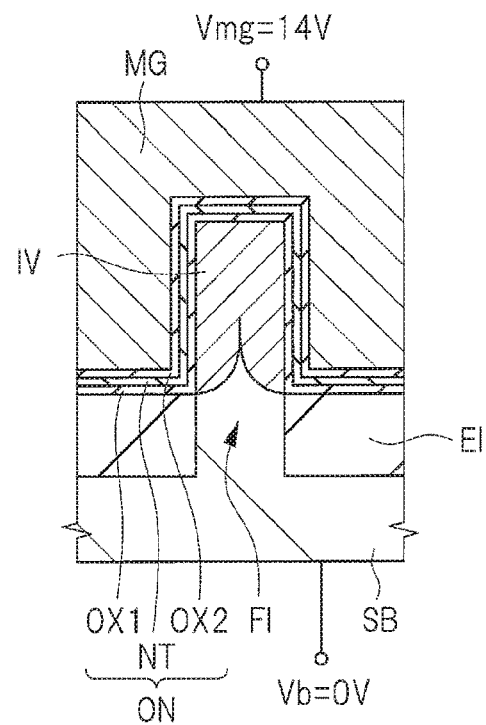
FIG. 9 is a cross-sectional view illustrating the semiconductor device according to the first embodiment of the present invention.

FIG. 7 is a view illustrating a cross-section taken along the y direction and a z direction and including the memory gate electrode MG of FIG. 6, and the cross-section mainly includes the fin FI and the memory gate electrode MG surrounding the fin FI. FIG. 9 is a view illustrating a cross-section taken along the y direction and the z direction and including the memory gate electrode MG of FIG. 8, and the cross-section mainly includes the fin FI and the memory gate electrode MG surrounding the fin FI.

In perspective views of FIGS. 6 and 8, a cross-section of the fin FI at a central part of the thickness of the fin FI in the y direction is illustrated. In FIGS. 6 and 8, illustration of the source and drain regions is omitted, and illustration of a part of the element isolation region EI is omitted. In FIGS. 6 and 9, illustration of the well is also omitted. In FIGS. 6 and 7, in the cross-section, diffusion of a potential applied to the drain region DR is indicated as a voltage applied region VA. In FIGS. 8 and 9, in the cross-section, diffusion of a potential generated by induction is indicated as an induced voltage region IV.

In FIG. 6, the memory cell MC1 which is the selected memory cell is illustrated, and in FIG. 8, the memory cell MC2 which is the unselected memory cell is illustrated. Note that the memory cell MC2 illustrated in FIG. 8 is the unselected memory cell connected to the same control gate line CGL0, the memory gate line MGL0, and the source line SL0 as the selected memory cell MC1. That is, the memory cell MC2 illustrated in FIG. 8 is the unselected memory cell arranged in the same row as the selected memory cell MC1. Note that there is no perspective view or cross-sectional view illustrating an unselected memory cell positioned in a different row from the selected memory cell, that is, the unselected memory cell connected to the control gate line and the memory gate line different from the selected memory cell.

The voltage applied to each part of the selected memory cell on which the erasing of information (data) is performed is Vmg=14 V, Vs=Open, Vcg=1.2 V, Vd=0 V, and Vb=0 V, for example, as illustrated in FIGS. 5, 6, and 7. That is, the memory gate electrode MG is applied with a voltage of about 10 to 16 V (e.g., 14 V), for example, the drain region DR is applied with 0 V, and the source region SR is in the open state in which no voltage is applied.

In this case, since the drain region DR is applied with 0 V, in the vicinity of the drain region DR (not illustrated in FIG. 7) in the fin FI, the voltage applied region VA having 0 V is expanded. That is, the voltage applied region VA is a region in which a potential is 0 V. The voltage applied region VA is drawn by the positive voltage applied to each of the control gate electrode CG and the memory gate electrode MG and is extended up to directly below each of the control gate electrode CG and the memory gate electrode MG. That is, a potential of the channel region directly below the memory gate electrode MG is 0 V. Also, as illustrated in FIG. 7, the voltage applied region VA is expanded not only on the upper surface of the fin FI but also on the side wall of the fin FI covered by the memory gate electrode MG, and accordingly, a potential of the side wall of the fin FI becomes 0 V.

Accordingly, a potential difference between the memory gate electrode MG and a front surface of the fin FI (channel region) becomes a large value from 10 to 16 V (e.g., 14 V). Due to this potential difference, in the selected memory cell, a hole is tunneled from the memory gate electrode MG, and the hole is injected into the silicon nitride film NT of the ONO film ON, whereby the erasing is performed. At this time, from the memory gate electrode MG, the hole is tunneled through the silicon oxide film OX2 by the FN tunneling (FN tunnel effect) and is injected into the ONO film ON, and the hole is captured by the trap level of the silicon nitride film NT constituting the ONO film ON. As a result, the threshold voltage of the memory transistor is decreased. That is, the memory transistor enters an erasing state.

Also, the voltage applied to each part of the unselected memory cell on which the erasing of information (data) is not performed, that is, the unselected memory cell connected to the same control gate line, the memory gate line, and the source line as the above-described selected memory cell is Vmg=14 V, Vs=Open, Vcg=1.2 V, Vd=Open, and Vb=0 V, for example, as illustrated in FIGS. 5, 8, and 9. That is, a difference from the selected memory cell is only in that the drain region DR is not applied with 0 V and is in the open state in which no voltage is applied.

Since in the unselected memory cell, no voltage is applied to the drain region DR, the voltage applied region VA (see FIG. 6) is not formed on a drain region side of the fin FI. Thus, the voltage applied region VA having 0 V is not drawn by each potential of the control gate electrode CG and the memory gate electrode MG or is not expanded inside the fin FI directly below the memory gate electrode MG. For this reason, as illustrated in FIGS. 8 and 9, a voltage is induced in the fin FI by the voltage of the memory gate electrode MG which is adjacent to the fin FI interposing the ONO film ON, whereby the induced voltage region IV is formed. That is, the induced voltage region IV is generated by coupling with the memory gate electrode MG, and inside the fin FI, a channel potential is in a floating state in the induced voltage region IV.

The induced voltage region IV is formed inside the fin FI that is in proximity of the memory gate electrode MG interposing the ONO film ON, and a potential thereof is about a half of the voltage applied to the memory gate electrode MG. That is, the potential of the induced voltage region IV is about 5 to 8 V, for example, and here, the potential of the induced voltage region IV is 7 V, for example. As illustrated in FIG. 9, since the memory gate electrode MG covers not only the upper surface of the fin FI but also the side walls on both sides thereof in the y direction, the induced voltage region IV is formed not only on the upper surface thereof but also on the side walls thereof.

Reasons why such induced voltage region IV is generated are that the fin FI having a small width in the y direction is surrounded by the memory gate electrode MG and the voltage is induced in an upper region in the fin FI induced by the high voltage of the memory gate electrode MG, and that the voltage Vb (0 V) applied to the well WL is difficult to reach such region, or the induced voltage region IV.

At this time, a potential difference between the fin FI and the memory gate electrode MG is about 7 V, which is only about a half of the potential difference between the fin FI and the memory gate electrode MG (e.g., 14 V) in the selected memory cell described with reference to FIGS. 6 and 7. In this case, since a potential difference between the voltage applied to the memory gate electrode MG (e.g., 14 V) and the voltage of the channel region (e.g., 7 V) is small, the silicon nitride film NT which is the trap insulating film is not applied with a sufficient electric field, whereby the hole in the memory gate electrode MG is not injected into the ONO film ON. That is, the erasing is not performed on the unselected memory cell, and a charge (data) trapped in the ONO film ON is retained.

Also, the voltage applied to each part of the unselected memory cell positioned in a different row from the selected memory cell and in the same column as the selected memory cell, that is, the unselected memory cell connected to the control gate line and the memory gate line different from the selected memory cell and connected to the same bit line as the selected memory cell (e.g., the memory cells MC5, MC9, and MC13 illustrated in FIG. 5) is as follows. That is, the voltage applied to each part of the unselected memory cell is Vmg=0 V, Vs=Open, Vcg=0 V, Vd=0 V, and Vb=0 V, for example.

In this case, a potential difference between the voltage applied to the memory gate electrode (Vmg=0 V) and the voltage of the channel region (e.g., 0 V) is little, whereby the hole in the memory gate electrode is not injected into the ONO film. That is, the erasing is not performed on the unselected memory cell, and the charge (information) trapped in the ONO film is retained.

Also, the voltage applied to each part of the unselected memory cell positioned in a different row from the selected memory cell and positioned in a different column from the selected memory cell, that is, the unselected memory cell connected to the control gate line, the memory gate line, and the bit line different from the selected memory cell (e.g., the memory cells MC6 to MC8, MC10 to MC12, and MC14 to MC16 illustrated in FIG. 5) is as follows. That is, the voltage applied to each part of the unselected memory cell is Vmg=0 V, Vs=Open, Vcg=0 V, Vd=Open, and Vb=0 V, for example.

In this case, a potential difference between the voltage applied to the memory gate electrode (Vmg=0 V) and the voltage of the channel region (e.g., 0 V) is little, whereby the hole in the memory gate electrode is not injected into the ONO film. That is, the erasing is not performed on the unselected memory cell, and the charge (information) trapped in the ONO film is retained.

Read Operation of Memory Cell

In reading, the voltage applied to each part of the selected memory cell on which the reading is performed is Vmg=0 V, Vs=0 V, Vcg=1.5 V, Vd=1.5 V, and Vb=0 V, for example. By setting the voltage Vmg applied to the memory gate electrode MG in the reading to a value between the threshold voltage of the memory transistor in the writing state and the threshold voltage thereof in the erasing state, it is possible to discriminate between the writing state and the erasing state.

In the above-described write operation, erase operation, and read operation, the same voltage (Vb=0 V) is applied to the well WL of each of the selected memory cell and the unselected memory cell, whereby it is not necessary to apply a different voltage to the well WL for each of the memory cells.

<Effect of Semiconductor Device>

Figure 12:
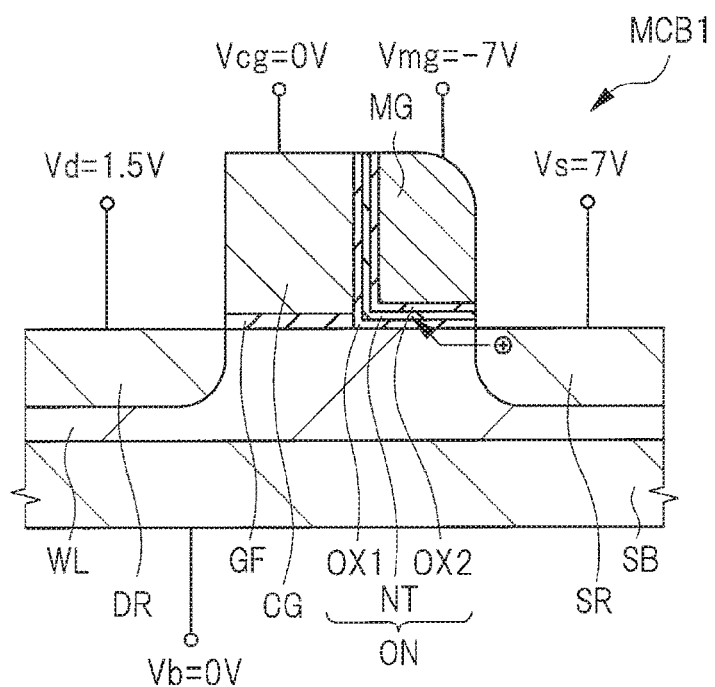
FIG. 12 is a cross-sectional view illustrating a semiconductor device according to a comparative example of the present invention.
Figure 13:
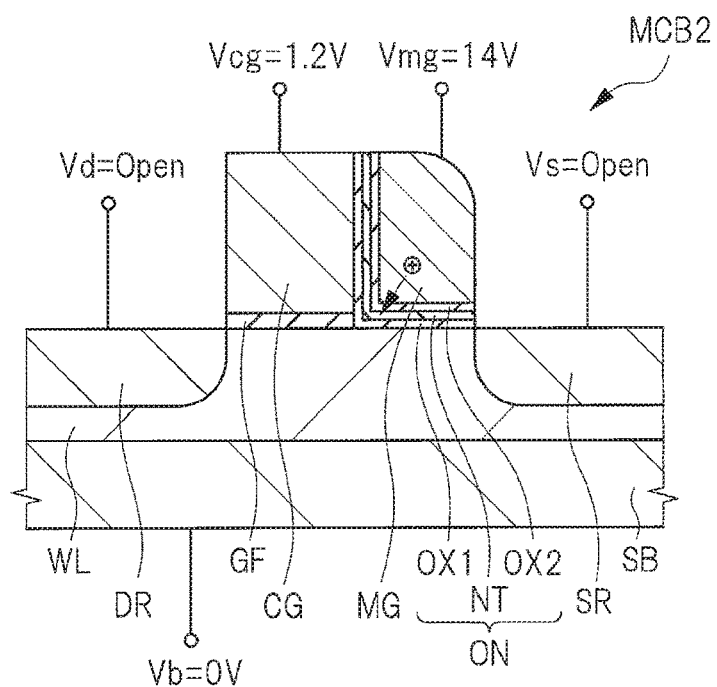
FIG. 13 is a cross-sectional view illustrating the semiconductor device according to another comparative example of the present invention.
Figure 14:
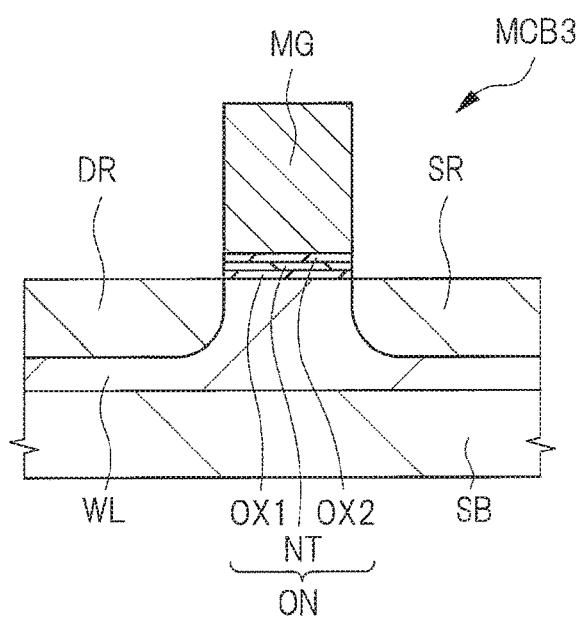
FIG. 14 is a cross-sectional view illustrating the semiconductor device according to still another comparative example of the present invention.

Hereinafter, an effect of the semiconductor device according to the first embodiment will be described with reference to FIGS. 12 to 14 illustrating a semiconductor device according to comparative examples. FIGS. 12 to 14 are cross-sectional views illustrating the semiconductor device according to the comparative examples, and the cross-sectional views include the memory cell formed on a bulk silicon substrate. Note that the bulk silicon substrate referred to herein is a flat silicon substrate and is not a substrate having the above-described fin or a substrate having an SOI structure described below. The MISFET on the bulk silicon substrate has the source and drain regions and the channel region in a flat main surface of the substrate, and it is an element having the gate electrode over the channel region interposing the insulating film. Also, in FIGS. 12 and 13, there is illustrated a structure in which the memory gate electrode is formed into aside wall shape that is adjacent to the side wall of the control gate electrode.

In the non-volatile memory using the split gate type MONOS memory, being capable of individually performing the write and the erase operations on each of the memory cells arranged in an array may lead to reduction of an element area required for storage processing of a minimum unit (bit) of data. That is, it is possible to achieve an increase of storage capacity of a memory and scaling of a semiconductor chip.

Here, as the comparative example, a case where the erase operation is performed by using the BTBT mechanism on the split gate type MONOS memory formed on the bulk silicon substrate will be described with reference to FIG. 12. As illustrated in FIG. 12, a memory cell MCB1 formed on the main surface of the semiconductor substrate SB which is the bulk silicon substrate has the same structure as that of the memory cell MC illustrated in FIG. 3 in a cross-section illustrated in FIG. 12 except that it is not formed on the fin. The memory array having the plurality of memory cells MCB1 has the same circuit configuration as the array illustrated in FIG. 1.

In the erasing by the BTBT mechanism, the erasing is performed by injecting a hole generated by the BTBT into the charge storage portion (silicon nitride film NT of the ONO film ON). The voltage applied to each part of the selected memory cell on which the erasing is performed by the BTBT mechanism is as follows. That is, the voltage applied to each part of the selected memory cell is Vmg=−7 V, Vs=7 V, Vcg=0 V, Vd=1.5 V, and Vb=0 V, for example. By applying such voltages, the hole is generated by a BTBT phenomenon and accelerated by an electric field, and accordingly, the hole is injected into the silicon nitride film NT constituting the ONO film ON of the selected memory cell. Accordingly, a threshold voltage of the memory transistor is decreased. That is, the memory transistor enters an erasing state.

Here, whether or not the predetermined memory cell is selected as a target of the erasing in performing the erasing by the BTBT mechanism is determined by the voltage applied to the source line connected to the source region SR. Note that, even when the voltage Vs=7 V is applied to the source line, when the voltage Vmg applied to the memory gate line which is connected to the memory gate electrode MG is not −7 V, for example, but is 0 V, for example, the memory cell connected to the memory gate line is not selected. However, since the memory gate line and the source line are the signal lines arranged in parallel to each other, in a case where the erase operation is performed, it is necessary to select all of the plurality of memory cells arranged in one row that is connected to the predetermined memory gate line and the predetermined source line.

That is, in a case where data stored in the memory cell MC1 of FIG. 1 is erased, for example, the memory cell MC1 and the memory cells MC2 to MC4 connected to the same memory gate line MGL0 and the source line SL0 as the memory cell MC1 are selected, and data in the selected memory cells is erased. Thus, it is not possible to erase the data for each of the memory cells.

Next, as the comparative example, a case where the erase operation is performed by using the FN mechanism on the split gate type MONOS memory formed on the bulk silicon substrate will be described with reference to FIG. 13. As illustrated in FIG. 13, a memory cell MCB2 formed on the main surface of the semiconductor substrate SB which is the bulk silicon substrate has the same structure as that of the memory cell MC illustrated in FIG. 3 in a cross-section illustrated in FIG. 13 except that it is not formed on the fin. Also, the memory array having the plurality of memory cells MCB2 has the same circuit configuration as the array illustrated in FIG. 1.

The voltage applied to each part of the selected memory cell on which the erasing is performed by the FN mechanism is as follows. That is, the voltage applied to each part of the selected memory cell is Vmg=14 V, Vs=Open, Vcg=1.2 V, Vd=Open, and Vb=0 V, for example. By applying such voltages, although no voltage is applied from the bit line and the source line, potential (Vb=0 V) of the well WL expands to the channel region, whereby a potential difference between the memory gate electrode MG and the channel region is about 14 V. Thus, due to such a large potential difference, the hole in the memory gate electrode MG is injected into the silicon nitride film NT. Accordingly, the threshold voltage of the memory transistor is decreased. That is, the memory transistor enters the erasing state. Also, the voltage applied to each part of the above-described selected memory cell may also be Vmg=14 V, Vs=Open, Vcg=0 V, Vd=Open, and Vb=0 V, for example.

Note that, although, in a voltage application condition of the selected memory cell according to the comparative example illustrated in FIG. 13, the control gate electrode CG is applied with 0 V, in the erase operation of the first embodiment described with reference to FIG. 6, the control gate electrode CG of the selected memory cell is applied with 1.2 V, which is different from the comparative example. However, whether the voltage applied to the control gate electrode CG is 0 V or 1.2 V does not affect whether the memory cell is selected or not, and the voltage applied to the control gate electrode CG may be either 0 V or 1.2 V in the selected memory cell illustrated in FIGS. 6 and 13.

Thus, the voltage application condition of the selected memory cell according to the comparative example illustrated in FIG. 13 is substantially the same as the voltage application condition of the selected memory cell according to the first embodiment illustrated in FIG. 6. Here, in the comparative example, whether or not the predetermined memory cell is selected as a target of the erasing in performing the erasing by the FN mechanism is determined by the voltage applied to the memory gate line connected to the memory gate electrode MG.

That is, it is not possible to individually select a memory cell on which the erasing is performed by a combination of a signal of the memory gate line and a signal of the signal line intersecting with the memory gate line. Thus, in a case where the erase operation is performed, it is necessary to select all of the plurality of memory cells arranged in one row connected to the predetermined memory gate line.

That is, to erase data stored in the memory cell MC1 of FIG. 1, for example, the memory cell MC1 and the memory cells MC2 to MC4 connected to the same memory gate line MGL0 as the memory cell MC1, are selected, and then, data in these selected memory cells are erased. Thus, it is not possible to erase the data for each of the memory cells.

Note that, in the comparative example illustrated in FIG. 13, with an aim of unselecting another memory cell connected to the same memory gate line as the selected memory cell, it may be considered to make an electric field between the memory gate electrode MG and the channel region small by applying a high voltage to the drain region DR of the unselected memory cell. In this method, however, it is necessary to increase pressure resistance between the control gate electrode CG and the drain region DR, and this method may be difficult to be achieved.

As described above, in a case where the erase operation is performed on the memory cell on the bulk silicon substrate by the BTBT mechanism or by the FN mechanism, it is not possible to erase the data in units of a memory cell, and it is necessary to use the plurality of memory cells arranged in one row along a specific source line, for example, as a minimum unit (bit) of data. It may be also considered to divide the source line, the memory gate line, or the like extending in the row direction at multiple places in the memory array. That is, it is also possible to arrange a plurality of signal lines such as the source lines in the row direction and to separately control the source lines. That is, it is considered to perform the erasing all at once on all of the plurality of memory cells included in each block or each sector provided in the memory array.

In such case as well, however, it is necessary to use the memory cells arranged in one row or the plurality of memory cells arranged in a matrix as the minimum unit (bit) of data. For this reason, it is necessary to reduce the number of memory cells arranged in one row by dividing the array in order that it can be used as the memory cell of the EEPROM. This leads to increased signal lines and complicated circuits, whereby an area of the semiconductor device is increased. Thus, in the above-described comparative example, there is a problem that it is difficult to increase the storage capacity per unit area of the semiconductor device having the EEPROM memory array (memory cell array) structure and to miniaturize the semiconductor chip.

Next, as the comparative example, a case where the erase operation is performed on the memory cell of the EEPROM formed on the bulk silicon substrate will be described with reference to FIG. 14. As illustrated in FIG. 14, a memory cell MCB3 formed on the main surface of the semiconductor substrate SB which is the bulk silicon substrate includes the memory gate electrode MG formed over the semiconductor substrate SB interposing the ONO film ON, and the source region SR and the drain region DR formed in the main surface of the semiconductor substrate SB lateral to the memory gate electrode MG. Also, the memory array having the plurality of memory cells MCB3 has the same circuit configuration as the array illustrated in FIG. 1 except that the memory array does not have a control gate line and a control transistor and that a signal line extending in the column direction, like the bit line, and controlling a well potential of each of the memory cells is disposed. Note that the voltage applied to the memory gate electrode MG illustrated in FIG. 14 is indicated as Vmg, and description thereof will be given below.

In a case where the erasing is performed on the memory cell MCB3 of the EEPROM, the voltage applied to each part of the selected memory cell is Vmg=0 V, Vs=Open, Vd=16 V, and Vb=16 V. By applying such voltages, the potential (Vb=16 V) of the well WL expands to the channel region, and accordingly, a potential difference between the memory gate electrode MG and the channel region is about 16 V. Thus, the hole is injected from a side of the channel region into the silicon nitride film NT of the ONO film ON, and accordingly, the erase operation is performed.

In contrast, there are three types in the voltage applied to the unselected memory cell of the EEPROM on which the erase operation is not performed, as follows.

First, the voltages applied to the unselected memory cell connected to the same memory gate line as the selected memory cell, that is, the unselected memory cell positioned in the same row as the selected memory cell, are Vmg=0 V, Vs=Open, Vd=16 V, and Vb=0 V. In this case, both of the voltages of the memory gate electrode MG and the channel region influenced by the voltage of the well WL become 0 V, and accordingly, there is no potential difference between the memory gate electrode MG and the channel region. Thus, injection of the hole is not performed, and the charge in the ONO film ON is retained, whereby the erasing of data is not performed.

Second, the voltages applied to the unselected memory cell connected to the same signal line for controlling the well potential as the selected memory cell, that is, the unselected memory cell positioned in the same column as the selected memory cell, are Vmg=16 V, Vs=Open, Vd=16 V, and Vb=16 V. In this case, both of the voltages of the memory gate electrode MG and the channel region influenced by the voltage of the well WL become 0 V, and accordingly, there is no potential difference between the memory gate electrode MG and the channel region. Thus, injection of the hole is not performed, and the charge in the ONO film ON is retained, whereby the erasing of the data is not performed.

Third, the voltages applied to the unselected memory cell connected to neither the memory gate line connected to the selected memory cell nor the signal line for controlling the well potential, that is, the unselected memory cell positioned in neither the same row nor the same column as the selected memory cell are Vmg=16 V, Vs=Open, Vd=16 V, and Vb=0 V. In this case, the voltage (Vmg=16 V) applied to the drain region DR is drawn by the positive voltage of the memory gate electrode MG, and accordingly, a potential of the channel region directly below the memory gate electrode MG becomes 16 V. Accordingly, since both of the voltages of the memory gate electrode MG and the channel region influenced by the voltage of the well WL become 16 V, there is no potential difference between the memory gate electrode MG and the channel region. Thus, injection of the hole is not performed, and the charge in the ONO film ON is retained, whereby the erasing of the data is not performed.

As described above, in the EEPROM, it is possible to select the memory cell on which the erasing is performed by a combination of the voltages applied to the memory gate line extending in the row direction and to the signal line for controlling the well potential extending in the column direction. For this reason, it is possible to individually select the memory cell in the memory array and perform the erasing. In the EEPROM in which the erase operation is performed by the above-described voltage application method, however, it is necessary to separately control the potential of the well of the separate memory cells in columns adjacent to each other. In this case, to separate the potential of the well of the memory cells adjacent to each other in the row direction, it is necessary to form an element isolation region between the memory cells to have a large width. Thus, an area of the memory array is increased, whereby there is a problem in that the scaling of the semiconductor chip and the increase of the capacity become difficult.

Note that the memory cell of the EEPROM that stores a charge in the ONO film ON has been described herein; however, the charge storage film of the memory cell is not limited to the silicon nitride film and may also be a floating gate composed of the polysilicon film.

Next, as a comparative example, although illustration is omitted, there is described a case where the erase operation is performed on the memory cell of a flash memory formed on the bulk silicon substrate. The memory cell of the flash memory has a structure similar to that of the EEPROM illustrated in FIG. 14, for example. However, in the memory cell of the flash memory, the well potential of the memory cells adjacent to each other is not separately controlled, which is a difference from the structure of the EEPROM described with reference to FIG. 14.

In a case where the erasing is performed on the memory cell of the flash memory, the voltage applied to each part of the selected memory cell is Vmg=−16 V, Vs=Open, Vd=0 V, and Vb=0 V. By applying such voltages, the well potential (Vb=0 V) expands to the channel region, and accordingly, a potential difference between the memory gate electrode and the channel region is about 16 V. Thus, the hole is injected from the channel region side into the silicon nitride film of the ONO film, and accordingly, the erase operation is performed.

In the memory cell of the flash memory, whether or not the predetermined memory cell is selected as a target of the erasing in performing the erasing is determined only by the voltage applied to the memory gate line connected to the memory gate electrode. That is, all of the memory cells in one row connected to the memory gate line in the memory cell array are selected, and data thereof is erased. Thus, since it is necessary to reduce the number of memory cells arranged in one row by dividing the array to use as the memory cell of the EEPROM, there is a problem in that the increase of the storage capacity per unit area of the semiconductor device and the scaling of the semiconductor chip are difficult.

Accordingly, in the semiconductor device according to the first embodiment, the substrate having the fin is prepared instead of the bulk silicon substrate, the split gate type MONOS memory is provided on the fin, and the erase operation is performed by the FN mechanism, whereby it is possible to individually select the memory cell on which the erasing is performed.

The configuration of the MONOS memory and applied voltages of the semiconductor device according to the first embodiment are similar to those of the comparative example in which the erasing is performed by the FN mechanism described with reference to FIG. 13. In the erasing by the FN mechanism in the memory cell MCB2 on the bulk silicon substrate described with reference to FIG. 13, however, as described with reference to FIG. 8, even when the drain region DR is applied with no voltage and the bit line is in the open state, since the channel region is not covered by the memory gate electrode MG, an induced voltage is not generated in the channel region. Thus, the potential of the channel region directly below the memory gate electrode MG is influenced by the voltage applied to the well WL and becomes 0 V.

In contrast, in the erase operation according to the first embodiment, as described with reference to FIGS. 6 and 7, in the selected memory cell, the erasing is performed due to the large potential difference generated between the voltage applied region VA extending in the channel region and the memory gate electrode MG. In contrast, as described with reference to FIGS. 8 and 9, in another memory cell MC connected to the memory gate line same as the selected memory cell, even when the voltage Vb applied to the well WL is 0 V, since the upper surface and side wall of the fin FI are surrounded by the memory gate electrode MG with high withstand voltage, the induced voltage region IV is generated in the fin FI adjacent to the memory gate electrode MG. Thus, since the potential difference between the channel region having the induced voltage region IV and the memory gate electrode MG is small, the erasing is not performed in the unselected memory cell MC.

That is, the memory cell MC is not selected as the target of the erase operation, and among the plurality of memory cells MC arranged in one row, it is possible to select only the specific memory cell MC and to erase data thereof. In addition, the memory cell MC in a different row from the selected memory cell can be unselected by decreasing the voltage applied to the memory gate electrode MG. That is, in the first embodiment, by applying the predetermined voltage to the bit line and by applying the predetermined voltage to the memory gate line extending in a direction orthogonal to the bit line, it is possible to selectively perform the erasing on the memory cell positioned at a cross point of the bit line and the memory gate line. In this case, the memory gate lines MGL0 to MGL3 illustrated in FIG. 1 function as word lines.

Thus, in the memory cell array provided with the plurality of memory cells arranged in a matrix, it is possible to perform the write operation, the erase operation, and the read operation for each of the memory cells. For this reason, it is possible to reduce the element area required for the storage processing of the minimum unit (bit) of data. In addition, unlike the EEPROM described with reference to FIG. 14, when performing the write operation, the erase operation, and the read operation in the semiconductor device according to the first embodiment, the same potential is supplied to the wells WL of all of the memory cells MC in the memory array, and accordingly, it is not necessary to secure a large width of the element isolation region between the memory cells MC. Thus, it is possible to achieve the increase of the storage capacity of the memory and the scaling of the semiconductor chip. Thus, it is possible to improve performance of the semiconductor device.

Second Embodiment

Hereinafter, a description will be given of, in an erase operation of a split gate type MONOS memory provided on an SOI substrate, erase operation for each memory cell by forming an induced voltage region in a channel region and accordingly, setting a memory cell to be unselected in the same manner as in the first embodiment.

<Structure of Semiconductor Device>

Figure 10:
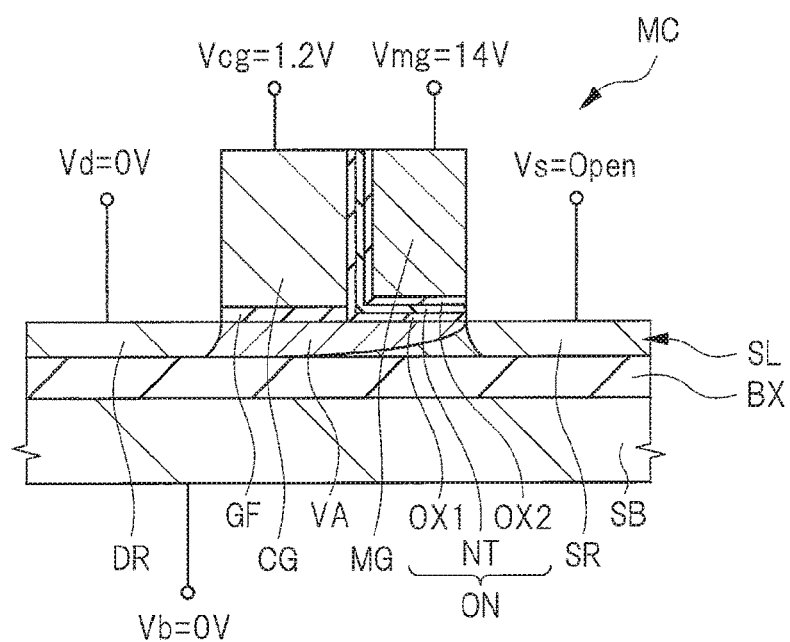
FIG. 10 is a cross-sectional view illustrating a semiconductor device according to a second embodiment of the present invention.
Figure 11:
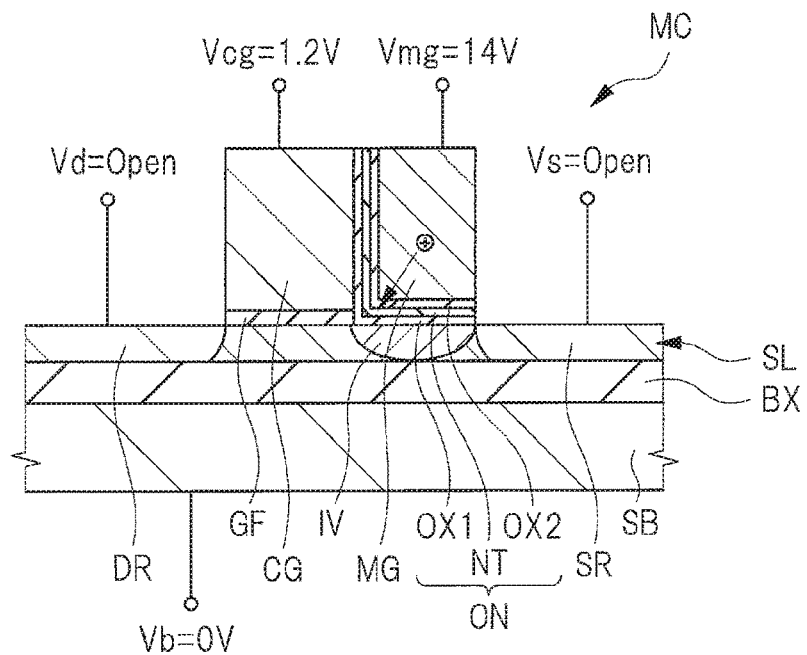
FIG. 11 is a cross-sectional view illustrating the semiconductor device according to the second embodiment of the present invention.

Hereinafter, with reference to FIGS. 10 and 11, a semiconductor device according to the second embodiment will be described. FIGS. 10 and 11 are cross-sectional views illustrating the memory cell constituting the semiconductor device according to the second embodiment.

The semiconductor device according to the second embodiment is different from the semiconductor device according to the first embodiment in that it has the SOI substrate and is not provided with the fin. In a cross-section illustrated in FIGS. 10 and 11, a structure of a memory cell MC is the same as that of the first embodiment illustrated in FIG. 3. That is, as illustrated in FIGS. 10 and 11, the semiconductor device according to the second embodiment includes a semiconductor substrate SB, a buried oxide film BX formed over the semiconductor substrate SB, and an SOI substrate having a layered structure with a semiconductor layer (silicon layer, SOI layer) SL formed over the buried oxide film BX. On the SOI substrate, the memory cell MC of the split gate type MONOS memory is formed.

In the same manner as the memory cell MC described with reference to FIG. 3, the memory cell MC includes the source region SR, the drain region DR, the control gate electrode CG on the gate insulating film GF, the ONO film ON, and the memory gate electrode MG. However, the well (not illustrated), the source region SR, and the drain region DR are formed in the semiconductor layer SL and are not formed in the semiconductor substrate SB. That is, a channel (channel region) of the memory cell MC is formed between the source region SR and the drain region DR in the semiconductor layer SL.

In the MISFET, particularly in an off state, a depletion layer is generated between a source region and a drain region. Here, in a case where the depletion layer is generated in the semiconductor layer SL in a control transistor and a memory transistor which are the MISFET on the SOI substrate, the depletion layer is formed directly below each of the control gate electrode CG and the memory gate electrode MG from an upper surface of the semiconductor layer SL to a lower surface thereof. That is, a region between the source region SR and the drain region DR is turned into fully depletion. This is because a film thickness of the semiconductor layer SL is small and a voltage applied to the semiconductor substrate is not expanded in the semiconductor layer SL.

In this manner, in an element formed on the SOI substrate, it is possible to suppress short channel characteristics without introducing impurity into the channel region. As a result, it is possible to improve mobility of an electron in the channel region as well as to improve variation of the element due to impurity fluctuation. For this reason, by manufacturing the semiconductor device by using the SOI substrate, it is possible to improve integration density and operating speed of the semiconductor device as well as to improve an operation margin by reducing the variation.

A configuration of a memory array in which the plurality of memory cells MC are arranged in the MONOS memory provided on the SOI substrate according to the second embodiment is the same as the configuration described in the first embodiment with reference to FIGS. 1 to 5.

<Each of Write, Erase, and Read Operations of Memory Cell>

Here, an operation of the memory cell according to the second embodiment will be described. A voltage application condition to each part in each of the write, erase, and read operations is the same as that of the first embodiment, for example. That is, the write operation is performed by the SSI mechanism, and the erase operation is performed by the FN mechanism. However, a voltage Vb described below is a voltage applied to the semiconductor substrate SB and is not a voltage applied to the semiconductor layer SL.

That is, in the write operation by the SSI mechanism, a voltage applied to each part of the selected memory cell on which writing of information (data) is performed is Vmg=9 V, Vs=4.5 V, Vcg=1 V, Vd=0.2 V, and Vb=0 V. A voltage applied to each part of the unselected memory cell on which the writing of the information (data) is not performed is Vmg=9 V, Vs=4.5 V, Vcg=0 V, Vd=1.3V, and Vb=0 V, for example. Accordingly, in the write operation, it is possible to perform the writing for each of the memory cells.

Also, the voltage applied to each part of the selected memory cell on which the erasing of the information (data) is performed is Vmg=14 V, Vs=Open, Vcg=1.2 V, Vd=0 V, and Vb=0 V, for example, as illustrated in FIG. 10. That is, the memory gate electrode MG is applied with a voltage of about 10 to 16 V (e.g., 14 V), for example, the drain region DR is applied with 0 V, and the source region SR is in an open state in which no voltage is applied. Here, since the semiconductor substrate SB and the semiconductor layer SL are insulated by the buried oxide film BX, the voltage applied to the semiconductor substrate SB (Vb=0 V) is not applied to the semiconductor layer SL.

In this case, since the drain region DR is applied with 0 V, a voltage applied region VA having 0 V expands in the vicinity of the drain region DR in the semiconductor layer SL. The voltage applied region VA is drawn by the positive voltage applied to each of the control gate electrode CG and the memory gate electrode MG and extends up to directly below each of the control gate electrode CG and the memory gate electrode MG. That is, a potential of the channel region inside the semiconductor layer SL directly below the memory gate electrode MG is 0 V.

Accordingly, a potential difference between the memory gate electrode MG and a front surface (channel region) of the semiconductor layer SL is a large value from 10 to 16 V (e.g., 14 V). Due to this potential difference, in the selected memory cell, a hole is tunneled from the memory gate electrode MG, and the hole is injected into a silicon nitride film NT of the ONO film ON. Accordingly, the erasing is performed. At this time, from the memory gate electrode MG, the hole is tunneled through a silicon oxide film OX2 by FN tunneling (FN tunnel effect) and is injected into the ONO film ON, and the hole is captured by a trap level of the silicon nitride film NT constituting the ONO film ON. As a result, the threshold voltage of the memory transistor is decreased, and the memory transistor enters an erasing state.

Also, the voltage applied to each part of the unselected memory cell on which the erasing of the information (data) is not performed, that is, the unselected memory cell connected to the control gate line, the memory gate line, and the source line same as the above-described selected memory cell, is Vmg=14 V, Vs=Open, Vcg=1.2 V, Vd=Open, and Vb=0 V, for example, as illustrated in FIG. 11. That is, a difference from the selected memory cell is only in that the drain region DR is not applied with 0 V and is in an open state in which no voltage is applied.

Since, in the unselected memory cell, the drain region DR is applied with no voltage, the voltage applied region VA (see FIG. 10) is not formed on a side of the drain region DR in the semiconductor layer SL. Thus, the voltage applied region VA having 0 V is neither drawn by the potential of the control gate electrode CG and the memory gate electrode MG nor expanded inside the semiconductor layer SL directly below the memory gate electrode MG. In addition, the voltage Vb (0 V) applied to the semiconductor substrate SB is blocked by the buried oxide film BX and does not reach the semiconductor layer SL.

For this reason, in the unselected memory cell in which the drain region DR is in the open state, the semiconductor layer SL including the channel region is turned into the fully depletion. Thus, a voltage is induced in the semiconductor layer SL by the voltage of the memory gate electrode MG which is adjacent to the semiconductor layer SL interposing the ONO film ON, whereby an induced voltage region IV is formed. That is, in the semiconductor layer SL, the channel potential is in a floating state in the induced voltage region IV.

The induced voltage region IV is formed in the semiconductor layer SL which is in proximity to the memory gate electrode MG interposing the ONO film ON, and the potential thereof is about a half of the voltage applied to the memory gate electrode MG. That is, the potential of the induced voltage region IV is about 5 to 8 V, for example, and here, the potential of the induced voltage region IV is 7 V, for example.

At this time, a potential difference between the semiconductor layer SL and the memory gate electrode MG is about 7 V, which is about a half of the potential difference between the semiconductor layer SL and the memory gate electrode MG (e.g., 14 V) in the selected memory cell described with reference to FIG. 10. In this case, since a potential difference between the voltage applied to the memory gate electrode MG (e.g., 14 V) and the voltage of the channel region (e.g., 7 V) is small, the silicon nitride film NT which is the trap insulating film is not applied with a sufficient electric field, whereby the hole in the memory gate electrode MG is not injected into the ONO film ON. That is, the erasing is not performed on the unselected memory cell, and a charge (data) trapped in the ONO film ON is retained.

Also, the voltage applied to each part of the unselected memory cell positioned in a different row from the selected memory cell and in the same column as the selected memory cell, that is, the unselected memory cell connected to the control gate line and the memory gate line different from the selected memory cell and connected to the same bit line as the selected memory cell (e.g., the memory cells MC5, MC9, and MC13 illustrated in FIG. 5) is as follows. That is, the voltage applied to each part of the unselected memory cells is Vmg=0 V, Vs=Open, Vcg=0 V, Vd=0 V, and Vb=0 V, for example.

In this case, a potential difference between the voltage applied to the memory gate electrode (Vmg=0 V) and the voltage of the channel region (e.g., 0 V) is little, whereby the hole in the memory gate electrode is not injected into the ONO film. That is, the erasing is not performed on the unselected memory cell, and the charge (information) trapped within the ONO film is retained.

Also, the voltage applied to each part of the unselected memory cell positioned in a different row from the selected memory cell and positioned to a different column from the selected memory cell, that is, the unselected memory cell connected to the control gate line, the memory gate line, and the bit line different from the selected memory cell (e.g., the memory cells MC6 to MC8, MC10 to MC12, and MC14 to MC16 illustrated in FIG. 5) is as follows. That is, the voltage applied to each part of the unselected memory cell is Vmg=0 V, Vs=Open, Vcg=0 V, Vd=Open, and Vb=0 V, for example.

In this case, a potential difference between the voltage applied to the memory gate electrode (Vmg=0 V) and the voltage of the channel region (e.g., 0 V) is little, whereby the hole in the memory gate electrode is not injected into the ONO film. That is, the erasing is not performed on the unselected memory cell, and the charge (information) trapped in the ONO film is retained.

Note that the read operation can be performed in the same manner as that in the first embodiment.

<Effect of Semiconductor Device>

Hereinafter, an effect of the semiconductor device according to the second embodiment will be described.

In the semiconductor device according to the second embodiment, the split gate type MONOS memory is provided on the SOI substrate, not on the bulk silicon substrate, and the erase operation is performed by the FN mechanism, whereby it is possible to individually select the memory cell on which the erasing is performed.

In the erase operation according to the second embodiment, as described with reference to FIG. 10, in the selected memory cell, the erasing is performed due to the large potential difference generated between the voltage applied region VA extending in the channel region and the memory gate electrode MG. In contrast, as described with reference to FIG. 11, in another memory cell MC connected to the same memory gate line as the selected memory cell, even when the voltage Vb applied to the semiconductor substrate SB is 0 V, since the semiconductor layer SL is insulated from the semiconductor substrate SB, the induced voltage region IV is generated in the semiconductor layer SL adjacent to the memory gate electrode MG. Thus, since a potential difference between the channel region having the induced voltage region IV and the memory gate electrode MG is small, the erasing is not performed in the unselected memory cell MC.

That is, in an element in which a semiconductor region directly below the memory gate electrode MG is turned into fully depletion, the induced voltage region IV is generated by applying a positive voltage to the memory gate electrode MG, whereby it is possible to obtain the same effect as that of the first embodiment.

That is, the memory cell MC is not selected as a target of the erase operation, and among the plurality of memory cells MC arranged in one row, it is possible to select only the specific memory cell MC and to erase data thereof. Also, the memory cell MC in a different row from the selected memory cell can be unselected by decreasing the voltage applied to the memory gate electrode MG. Thus, in the second embodiment, by applying the predetermined voltage to the bit line and by applying the predetermined voltage to the memory gate line extending in a direction orthogonal to the bit line, it is possible to selectively perform the erasing on the memory cell positioned at a cross point of the bit line and the memory gate line.

Thus, in the memory cell array provided with the plurality of memory cells arranged in matrix, it is possible to perform the write operation, the erase operation, and the read operation for each of the memory cells. For this reason, it is possible to reduce an element area required for storage processing of a minimum unit (bit) of data. In addition, as in the EEPROM described with reference to FIG. 14, when performing the write operation, the erase operation, and the read operation in the semiconductor device, it is not necessary to supply different potential to the well of each of the memory cells adjacent to each other in the memory array, whereby it is not necessary to secure a large width of the element isolation region between the memory cells MC. Thus, it is possible to achieve an increase of storage capacity of the memory and scaling of the semiconductor chip, whereby it is possible to improve performance of the semiconductor device.

In the foregoing, the invention made by the inventor of the present invention has been concretely described based on the embodiments. However, it is needless to say that the present invention is not limited to the foregoing embodiments and various modifications and alterations can be made within the scope of the present invention.

What is claimed is:

1. A semiconductor device comprising:
   a plurality of memory cells arranged in a matrix on a semiconductor substrate,
   wherein each of the plurality of memory cells includes:
      a protruding portion being a part of the semiconductor substrate, protruding from an upper surface of the semiconductor substrate, and extending in a first direction along a main surface of the semiconductor substrate;
      a first gate electrode formed over an upper surface of the protruding portion interposing a first insulating film and extending in a second direction orthogonal to the first direction;
      a second gate electrode formed adjacent to a side wall of the first gate electrode interposing a second insulating film including a charge storage portion, formed over the upper surface of the protruding portion interposing the second insulating film, and extending in the second direction;

a drain region formed in the upper surface of the protruding portion adjacent to the first gate electrode; and a source region formed in the upper surface of the protruding portion adjacent to the second gate electrode, and wherein, when performing an erase operation, among the plurality of memory cells, in a first memory cell on which erasing is not performed, the drain region and the source region are not applied with a voltage, and the second gate electrode is applied with a positive voltage.

2. The semiconductor device according to claim 1, wherein, when performing the erase operation, among the plurality of memory cells, in a second memory cell on which the erasing is performed, the drain region is applied with a voltage of 0 V, and the second gate electrode is applied with the positive voltage.

3. The semiconductor device according to claim 2, wherein the second gate electrode of each of the first memory cell and the second memory cell is connected to a first wire, the drain region of the first memory cell is connected to a second wire, and the drain region of the second memory cell is connected to a third wire.

4. The semiconductor device according to claim 1, wherein, when performing the erase operation, in the upper surface of the protruding portion directly below the second gate electrode of the first memory cell, an induced voltage region is generated by the positive voltage applied to the second gate electrode.

5. The semiconductor device according to claim 1, wherein the second gate electrode covers the upper surface of the protruding portion and covers a side wall on both sides in the second direction of the protruding portion.

6. The semiconductor device according to claim 2, wherein, when performing the erase operation, the same voltage is applied to the semiconductor substrate directly below each of the first memory cell and the second memory cell.

7. The semiconductor device according to claim 2, wherein, when performing the erase operation, a first potential difference between the second gate electrode of the first memory cell and the upper surface of the protruding portion directly below the second gate electrode of the first memory cell is smaller than a second potential difference between the second gate electrode of the second memory cell and the upper surface of the protruding portion directly below the second gate electrode of the second memory cell.

8. The semiconductor device according to claim 1, wherein, when performing the erase operation, among the plurality of memory cells, in a second memory cell on which the erasing is performed, the erasing is performed by injecting a positive hole from the second gate electrode into the charge storage portion.

9. A semiconductor device comprising:
a plurality of memory cells arranged in a matrix on a substrate including a semiconductor substrate, a first insulating film provided over the semiconductor substrate, and a semiconductor layer formed over the semiconductor substrate interposing the first insulating film, wherein each of the plurality of memory cells includes:
a first gate electrode formed over an upper surface of the semiconductor layer interposing a second insulating film;
a second gate electrode formed adjacent to a side wall of the first gate electrode interposing a third insulating film including a charge storage portion and formed over the upper surface of the semiconductor layer interposing the third insulating film;
a drain region formed in the upper surface of the semiconductor layer adjacent to the first gate electrode; and
a source region formed in the upper surface of the semiconductor layer adjacent to the second gate electrode, and wherein, when performing an erase operation, among the plurality of memory cells, in a first memory cell on which erasing is not performed, the drain region and the source region are not applied with a voltage, and the second gate electrode is applied with a positive voltage.

10. The semiconductor device according to claim 9, wherein, when performing the erase operation, among the plurality of memory cells, in a second memory cell on which the erasing is performed, the drain region is applied with a voltage of 0 V, and the second gate electrode is applied with the positive voltage.

11. The semiconductor device according to claim 10, wherein the second gate electrode of each of the first memory cell and the second memory cell is connected to a first wire, the drain region of the first memory cell is connected to a second wire, and the drain region of the second memory cell is connected to a third wire.

12. The semiconductor device according to claim 9, wherein, when performing the erase operation, in the upper surface of the semiconductor layer directly below the second gate electrode of the first memory cell, an induced voltage region is generated by the positive voltage applied to the second gate electrode.

13. The semiconductor device according to claim 9, wherein, when performing the erase operation, a depletion layer reaching from the upper surface of the semiconductor layer to a lower surface of the semiconductor layer is generated.

14. The semiconductor device according to claim 10, wherein, when performing the erase operation, a first potential difference between the second gate electrode of the first memory cell and the upper surface of the semiconductor layer directly below the second gate electrode of the first memory cell is smaller than a second potential difference between the second gate electrode of the second memory cell and the upper surface of the semiconductor layer directly below the second gate electrode of the second memory cell.

15. The semiconductor device according to claim 9, wherein, when performing the erase operation, among the plurality of memory cells, in a second memory cell on which the erasing is performed, the erasing is performed by injecting a positive hole from the second gate electrode into the charge storage portion.

16. The semiconductor device according to claim 9, wherein the semiconductor substrate and the semiconductor layer are insulated from each other.

* * * * *